United States Patent [19]

Carlstedt

[11] Patent Number: 5,259,002
[45] Date of Patent: Nov. 2, 1993

[54] COMMUNICATION LINK

[75] Inventor: Lars G. Carlstedt, Partille, Sweden

[73] Assignee: Carlstedt Elektronik AB, Gothenborg, Sweden

[21] Appl. No.: 739,557

[22] Filed: Aug. 2, 1991

[30] Foreign Application Priority Data

Aug. 2, 1990 [SE] Sweden ............................. 9002559

[51] Int. Cl.$^5$ .......................................... H04L 27/28
[52] U.S. Cl. ........................................ 375/38; 375/17; 375/36
[58] Field of Search ................... 375/38, 40, 100, 102, 375/17, 36; 341/56, 57

[56] References Cited

U.S. PATENT DOCUMENTS

| | | | |
|---|---|---|---|
| 4,097,859 | 6/1978 | Looschen | 375/17 |
| 4,631,428 | 12/1986 | Grimes | 375/17 |
| 4,983,965 | 1/1991 | Doi et al. | 341/72 |
| 5,166,956 | 11/1992 | Baltus et al. | 375/36 |

FOREIGN PATENT DOCUMENTS 171075 10/1991 China .
2840006 2/1980 Fed. Rep. of Germany .
WO87/00367 1/1987 PCT Int'l Appl. .

OTHER PUBLICATIONS

"Halbleiter-Schaltungstechnik", 5th Edition, By Dr.--Ing. U, Tietz et al., pp. 617-619.
"Standard for Electrical Characteristics of Generators and Receivrs for Use In Balanced Digital Multipoint Systems", EIA Standard, RS-485, Apr. 1983, pp. 1-12.

Primary Examiner—Stephen Chin
Attorney, Agent, or Firm—Young & Thompson

[57] ABSTRACT

A method and an electronic communication link for piece of information serial transmission includes at multiple conductor constellation having at least three conductors (R, S, T). There could be provided at least three different combinations ((H,L,L), (L,H,L), (L,L,H)) of signal levels ($V_L$, $V_H$) on the conductors, which combinations are set in a prescribed order. One kind of piece of information, for instance "0", is transmitted by a change of combination in said prescribed order. The other kind of piece of information, for instance "1" is transmitted by a change of combination backwards against the prescribed order.

17 Claims, 4 Drawing Sheets

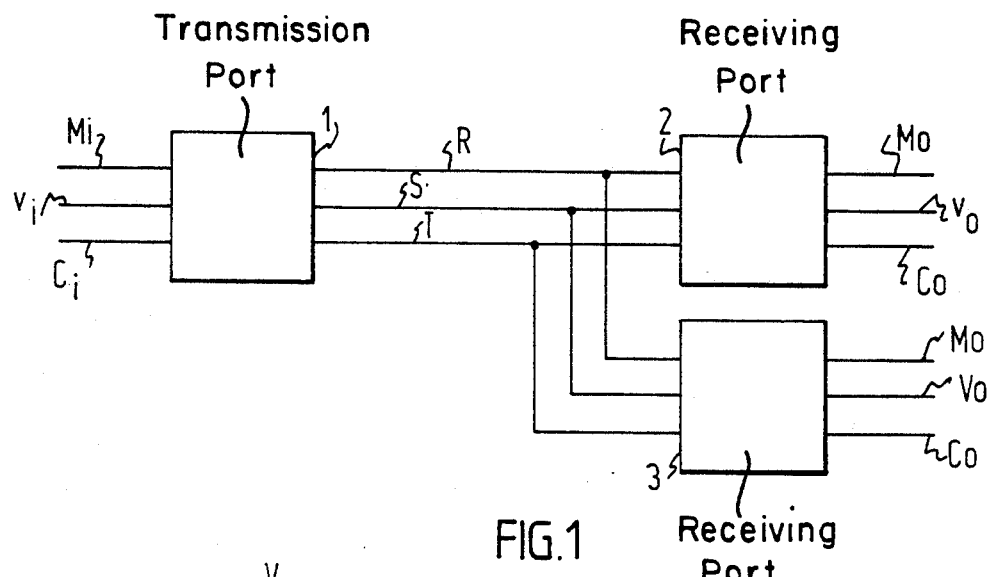
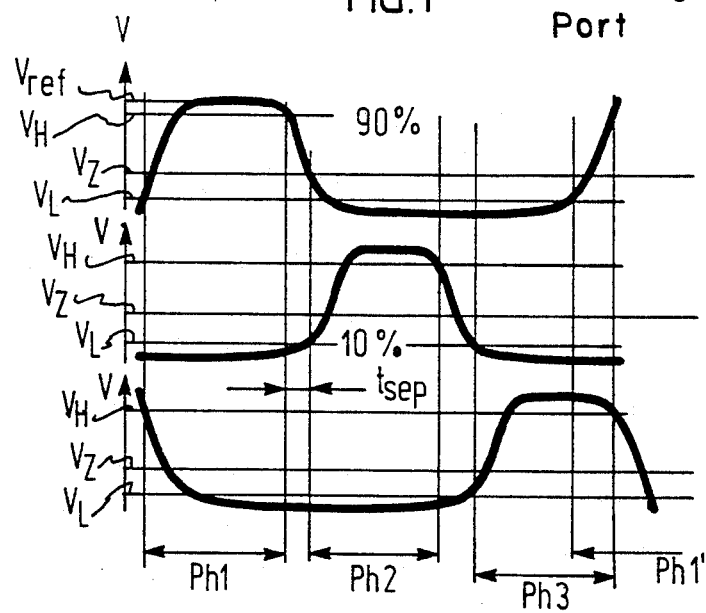
FIG.1
FIG.2

COMMUNICATION LINK

This invention relates to an electronic communication link for bit serial transmission to be used where speed and powerfulness are of importance.

BACKGROUND OF THE INVENTION

An increasing problem with communication links has arisen for digital communications on wafers, between wafers, on printed circuit boards and in cabinets with the growing demands on speed and powerfulness for the kind of electronic applications using the mentioned kind of techniques. A particular application is in digital electronic equipment, such as digital computers. The communication link according to the invention has been developed for transmission across distances of the order of a few mm in a chip.

Most improvements have been in the hardware. The introduction of VLSI and the enhancement in lithography has made it possible to build computers on only a chip that five years ago were super computers. The dimensions have shrunk exponentially and is now less than 1 micrometer. The clock rate as well as the number of active transistors have increased many orders of magnitude. When the packing density has been very tight and the operation speed has become extremely high, then wires of a few mm in such a chip have been very sensitive to disturbances both from external noise sources and from the internal circuits.

OBJECTS OF THE INVENTION

An object according to the invention is to provide a communication link for high rate bit serial transmission, on which communication can be reliably transferred.

Another object of the invention is to provide a communication link, on which data and clock signals can be transferred simultaneously without any need for matching of transmission lines regarding delays and transmission speed.

Still another object of the invention is to provide a communication link on which more information than what is usual could be transferred, such as codes indicating that a new word will be transmitted or be ended etc.

SUMMARY OF THE INVENTION

The object mentioned above is provided by a method for serial transmission of pieces of information, being of at least two kinds, the first being a binary digit "1", the second being a binary digit "0", including the steps of:
  a) transforming each piece of information into a coded signal including at least three analogue signals, each being selectable among at least two signal levels for a piece of information of said first and second kind;
  b) transferring said analog signals across the same amount of conductors as said analogue signals; and
  c) transforming said analog signals back to said piece of information.

Preferably said piece of information is of three kinds, the first being said binary digit "1", said second being said binary digit "0". and said third being "idling", and that for said piece of information "idling" at least a third signal level is provided for all said analog signals.

An electronic communication link according to the invention for serial transmission of pieces of information, being of at least two kinds, the first being a binary digit "1", the second being a binary digit "0", is including
  a) a multiple conductor constellation having at least three conductors (R,S,T), said constellation having an input side and an output side,
  b) at least one transmission port (1) connected to said input side of said constellation to which each information to be transferred is provided as a series of said pieces of information and which transforms each piece of information into a multiple part code, each part being transmitted to an individual one of said conductors in said constellation,
  c) at least one receiving port (2, 3) connected to said output side of said constellation receiving said multiple part code from said conductors in said constellation and converting it back.

Preferably the kinds of information signals to be transferred through the link are at least three, i.e. "0", "0" and "idling". Each coded signal for transmitting a "0" or "1" may be comprised of a combination of at least a first and a second nominal signal level to be individually provided on the wires of the multiple wire constellation. A number of different signal conditions will appear on the wires. In each of these conditions the different wires will have an individual potential. The individual potentials may be the same or different. The sum of the potentials on the wires divided with the number of wires provides a mean potential. This mean potential is approximately constant and independent of the signal condition on the wires. The change of signal conditions among the wires is made with the clock frequency on the input side of the communication cable, and the clock signal is therefore transferred to the output side together with the transferred information signals.

These features make it possible to transfer information in a way that may be as insensitive to disturbances as if it had been transferred by a coaxial cable.

A code for transmitting a signal representing an idling communication comprises preferably an idling nominal signal level, preferably the mean level, separate from the first and the second nominal signal level. If the wires are three, then during a "0"- and "1"-transmission each bit is transmitted by a change of signal levels on the wires such that one of the wires changes its signal level from the first level to the second level and a second of the wires changes its signal level from the second level to the first level and a third of the wires keeps its level, and in that the wires changing levels are different for a transmitted "0" and for a transmitted "1".

There are at least three different combinations of signal levels on the wires, which combinations are set in a prescribed order, and one kind of bit, for instance "1", is transmitted by a change of combination in the prescribed order and the other kind of bit, for instance "0", is transmitted by a change of combination backwards against the prescribed order. A bit serial transmission of a bit sequence is commenced and ended by providing an idling nominal signal level on all the wires separate from the first and the second nominal signal level. One kind of bit, for instance "1", is transmitted by a change of combination in the prescribed order and the other kind of bit, for instance "0", is transmitted by a change of combination backwards against the prescribed order. The beginning of a signal sequence after the idling signal starts with an initial phase state, that is, a certain combination of signal levels on the wires Preferably, the transmission starts with the transmission of a predetermined known bit a polarity reference bit, which may have a value of either "1" or "0". The receiving port will detect the direction of change of the combination of signal levels caused by this known bit, and it will use this information to correlate a certain direction of change with a certain value — "1" or "0" — of each following bit. After the transmission of this known bit, the information to be transmitted is transmitted as a series of bits, each "1" as a change of combination in one direction, and each "0" as a change in the opposite direction.

Naturally, the invention is not limited to signal serial transmission in itself, because several multiple wire constellations may be provided in parallel to each other each having a signal serial transmission but together transmitting in parallel.

BRIEF DESCRIPTION OF THE DRAWINGS

For a more complete understanding of the present invention and for further objects and advantages thereof, reference is now made to the following description taken in conjunction with the accompanying drawings, in which:

FIG. 1 shows a block diagram of an embodiment of the link according to the invention, FIG. 2 shows a diagram of embodiments of signals on wires in the link according to the invention.

With reference to FIG. 1, a transmission port 1 is connected to two receiving ports 2 and 3 with a multiple wire constellation having three wires R, S, T providing a data path. The transmission port 1 is an output port of an element, which transmits data to the data path, and the receiving ports are transmission ports of elements, which receive data from the data path. The constellation could be in the form of a three wire balanced cable. The wires are twisted or formed in such a way that they together form a good transmission line. The line could be provided in different ways depending on the medium, such as:

Figure 3:
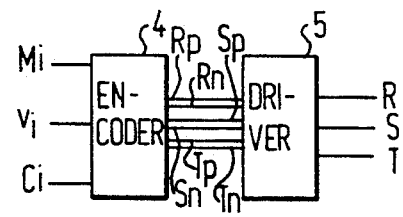
FIG. 3 shows an embodiment of a transmission port circuit.

a) A twisted cable without screen. An expected typical impedance will be around 120 ohm.
b) A bus having three wires on printed board. An expected typical impedance will be around 120 ohm.
c) Wires on a chip/wafer. An expected typical impedance will be around 130 ohm.

The port 1 is illustrated to have three input wires having the signals Mi, vi and Ci, and the ports 2 and 3 are illustrated to have three output wires having the signals Mo, vo and Co respectively. It is to be noted that the ports may be integral parts of different circuits. The information to be transferred through the wires R, S, T is on the first hand information determining whether the bus is in an idling state or an active state, and on the second hand binary information in the form of a series of bits ("1" or "0"). The signal Mi determines whether the bus is idling or active, $Mi=1$ setting the bus to an idling state, and $Mi=0$ setting the bus to an active state. The signal vi carries the digital information to be transferred on the bus when the bus is in its active state. The signal Ci is the clock signal and it will also be implicitly transferred.

The three wires R, S, T are provided with coded information such that they have individual signals. FIG. 2 shows an example of signal voltages on the wires R, S, and T as function of time.

Three different, nominal signal levels are used, i.e. $V_L$, $V_Z$ and $L_H$. $V_L$ and $V_H$ have opposing polarities on each side of $V_Z$. The mean value of the momentary signal levels on the three wires is constant and equal to $V_Z$, which could preferably be chosen to 0V.

$$V_L = -0.5 * V_H,$$

$$0.5 * V_{ref} < V_H < 1.0 * V_{ref}$$

where $V_{ref}$ is the maximum signal level for the signal $V_{ref}$ could for instance be 400 mV. $V_H$ is chosen to be 90% of $V_{ref}$ in the embodiment shown in FIG. 2. One must bear in mind that the communication link according to the invention is to be fed with high frequency signals not having ideal pulse forms, as apparent from FIG. 2. There should be a tolerance on all signal levels This tolerance could for instance be $+100$ mV. The signal level values should be guaranteed at any transmission port for the bus Examples of other voltage levels for the wires R,S,T are a potential floating between 2.0 and 4.0 V and a nominal mean potential 2.5 V.

An idling wire has the voltage $V_Z$. An idling bus has all the wires R, S and T on the voltage $V_Z$. A non-idling bus has, in the embodiment shown, one of the wires on or above $V_H$ and two of the wires on or below $V_L$. However, it is to be noted that one may instead chose to have two of the wires on or above $V_H$ and one of the wires on or below $V_L$, but then $V_L = -2*V_H$.

Thus, if we state that a wire on $V_Z$ has the state Z, that a wire on $V_H$ has the state H, and that a wire on $V_L$ has the state L, then the following combinations are due:

idle bus = (Z,Z,Z)
Ph1 bus = (H,L,L)
Ph2 bus = (L,H,L)
Ph3 bus = (L,L,H)

where Ph1 bus means that the bus has the state Ph1 as seen in FIG. 2, Ph2 bus that the bus has the state Ph2 and Ph3 bus that the bus has the state Ph3.

The bus is implemented as having a three phase rotating value when in non-idling state. A "1" is implemented by a forward step of rotation, a "0" is implemented by a backward step of rotation. Thereby, it is possible to arbitrary interchange the bus wires. Swapping wires does only mean that the rotation direction may be changed, and as will be described below, the information will be transferred correctly by the bus irrespective of how the wires are connected. The term "value" used in this description means a binary word or a piece of digital information. A value provided by a sequence of "1":s and "0":s is transmitted through the bus by the following sequence: Before transmission the mark signal (Mi="1") designates an idling bus state. The transmission starts with the mark signal changing (to Mi="0") to cause the bus to assume a non-idling (active state). The bus is set to an initial phase state, for instance Ph1, and after that all the information bits to be transmitted are transmitted as a series of forward and backward phase rotations. Finally the mark signal changes to the value designating an idling bus (Mi="1"). A forward rotation represents a digital "1" and selects a new state in the cyclical order Ph1, Ph2, Ph3, Ph1 etc. A backward rotation represents a digital "0" and selects a new state in the cyclical order Ph1, Ph3, Ph2, Ph1 etc.

The bit sequence on the bus consists of several bus pulses following after each other, i.e. each wire in the bus has an individual pulse train. The pulse length should be longer than a minimum value defined for the particular bus.

As apparent from FIG. 2, the transitions on the bus have the following limitations:

The separation time $t_{sep}$ between the clock phases Ph1, Ph2 etc is defined in relation to the 10% and 90% points of the relative swing, i.e. the time between when a transition from a high state in one of the wires R, S or T has fallen to 90% of its maximum level value $V_{ref}$ and when a low state in another of the wires having a transition from a low to a high state has arisen 10% from its minimum level value. The separation time $t_{sep}$ should be defined both for the transition between the idling state and a phase state and vice versa, and for the transitions between two phase states. During each phase state the signal values on all the wires must be steady, i.e. without any separations. As apparent from FIG. 2, on its right side, it may happen that two phases overlap each other, such as the phases Ph3 and Ph1'. This is allowed and even preferred and causes no problems. In such a case the "separation time" could be regarded as being negative.

During the idling bus state all signal levels should be on the $V_Z$-level for at least 70% of a clock period,.

The embodiment of an transmission port 1 in FIG. 1 shown in FIG. 3 includes an encoder 4 having the input signals Mi, vi and Ci and the output signals Rp, Rn, Sp, Sn, Tp, Tn. The output signals of the encoder 4 are fed to a driver 5 providing the signals R, S, T to be transferred.

Figure 4:
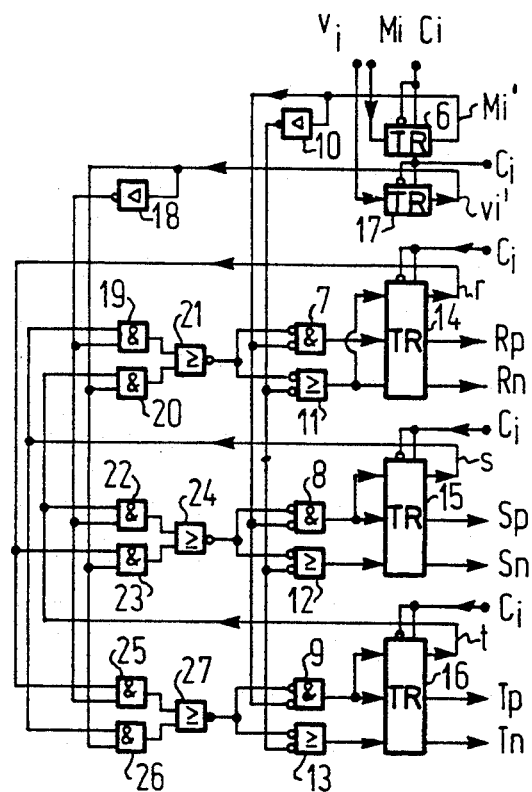
FIG. 4 shows an embodiment of an encoder in the port circuit shown in FIG. 3.

An embodiment of the encoder 4 is shown in FIG. 4. The signal Mi is connected to the input of a first temporary register 6. A temporary register is defined here as a register which when it receives a clock signal on a non inverted clock input stores a signal provided on its data input or inputs and when it receives a clock signal on an inverted clock input feeds the stored data out on its output or outputs. The temporary register 6 has one input and one output. The information Mi supplied to the register input will be stored during each clock signal, and the information stored in the register will be supplied on the register output as the signal Mi' during the intervals between clock signals. There will thus be a delay up to one clock cycle between a change in input information to the register, and a change in the output information supplied from the register. The registers 14, 15, 16, 17 further described below has the same function as the register 6 in this respect. The registers 14, 15, 16 do, however, store three bits each, while the registers 6 and 17 store one bit each.

The output of the register 6 is connected to an inverted input of three AND gates 7, 8 and 9, each having two inverted inputs and a non inverted output, and also via an inverter 10 to an inverted input of three OR gates 11, 12 and 13, each having two inverted inputs and a non-inverted output. The output of the AND gate 7 is connected to a central input of a temporary register 14 having three inputs and outputs and thus storing three bits. The output of the OR gate 11 is connected to the other two inputs of the register 14. The output of the AND gate 8 is connected to two inputs of a temporary register 15 having three inputs and outputs and thus storing three bits. The output of the OR gate 12 is connected to the remaining input of the register 15. The output of the AND gate 9 is connected to two inputs of a temporary register 16 having three inputs and outputs and thus storing three bits. The output of the OR gate 13 is connected to the remaining input of the register 16.

Thus, when the bus R,S,T shall be marked IDLE, and when thus the signal Mi is "1" designating an idling bus, then the AND gates 7, 8 and 9 will regard the output Mi' of the register 6 as a "0" on one of their inputs and provide a "0" on their outputs. Thus, register 14 will store a "0" in its central store, and the registers 15 and 16 a "0" on their upper two stores. The OR gates 11, 12 and 13 will have an output "1" during the mark period (the period when Mi="1", designating an idle bus). The OR gates 11, 12, 13 will regard the "0" signal on their input connected to the inverter 10 as a "1" and thus give a "1" on their output. Thus the register 14 will store a "1" in its outer two stores, and the registers 15 and 16 a "1" in their lowest store.

The values on the two lower outputs Rp, Rn, Sp, Sn, Tp, Tn from each of the registers 14, 15, 16 will be the following for the different combinations of the input signals Mi, vi:

Mi="1" (false, true)
vi="1" (true, true)
vi="0" (false, false)

It is to be noted that when Mi="1" then the value of the signal vi has no significance, because the bus is then idle. The value vi is only to be transferred during intervals when Mi="0". The content in the register stores will be provided on the register outputs opposite to their inputs during the following clock half cycle. The circuit in FIG. 4 has a delay of two clock cycles between its input and output signals.

The uppermost outputs of the registers 14, 15, 16 are designated r, s and t, respectively. The combination of values of these three outputs indicate the phase state of the transmitting port. The phase state (0,0,0) indicates an idling bus, and when the bus is non-idling (active) it will at any instant assume one of the three phase states (1,0,0), (0,1,0), and (0,0,1). During a certain one of the latter three phase states two of the registers will have "0" at their outputs, and one register will have "1" at its outputs. Thus, for instance, during the phase state (1,0,0) the outputs are:

r=1,Rp=1,Rn=1,s=0,Sp=0,Sn=0,t=0,Tp=0,Tn=0.

As mentioned above a bit sequence to be transferred will start with a initial phase state, and the circuit in FIG. 4 will put this state to (1,0,0), directly after a period with an idling bus. During the enable period there is a shift in the cyclic phase state (1,0,0),(0,1,0) and (0,0,1) in the forward direction for a boolean true, i.e. "1", and in the backward direction for a boolean false, i.e. "0". This will be provided in the following way.

At the beginning of a signal transmission the mark signal Mi will change from "1" to "0". One clock cycle after that, the output of the register 6 will become "0", if the registers are of master-store-type,, and then the AND-gates 7, 8, 9 will regard their input coupled to the register 6 as being a "1" and the gates 11, 12, 13 having an inverted input connected to the inverter 10 will regard their input connected to the inverter 10 as a "0". Thus when the signal Mi changes to "0" and the output Mi' of the register 6 thereafter becomes a "0" the elements 7 to 9 can be regarded as being inverters. There is a two step delay through the encoder 4.

However, from having (0,1) on each of the outputs Rp, Rn and Sp, Sn and Tp, Tn the device in FIG. 4 shall start the cyclic changing order process from an initial phase state which is (1,0,0). The meaning of having the upper input of the register 14 coupled in another way than the registers 15 and 16 is to create this initial value which is provided on the upper output of each on of the registers 14 to 16 during the whole period when the mark signal Mi is "1".

The second inverting inputs of the gates 7 and are interconnected and connected to an inverted output of an OR gate 21. The outputs of two AND gates 19 and 20 are connected to each one of the two inputs of the OR gate 21. The second inverting inputs of the gates 8 and 12 are interconnected and connected to an inverted output of an OR gate 24. The outputs of two AND gates 22 and 23 are connected to each one of the two inputs of the OR gate 24. The second inverting inputs of the gates 9 and 13 are interconnected and connected to an inverted output of an OR gate 27. The outputs of two AND gates 25 and 26 are connected to each one of the two inputs of the OR gate 27. The upper output of the register 14 is connected to an input of the AND gates 23 and 25. The upper output of the register 15 is connected to an input to the AND gates 19 and 26. The upper output of the register 16 is connected to an input to the AND gates 20 and 22.

The input vi is connected to an input of a temporary register 17 having its output vi, fed directly to an input of the AND gates 20, 23, 26 and through an inverter 18 connected to an input of the AND gates 19, 22, 25. Thus the AND gates 20, 23, 26 will be used for making the forward cyclic transition, when vi is "1" and the AND gates 19, 22, 25 will be used for making the backward cyclic transition, when vi is "0".

As an example, vi being a "0" directly after the signal Mi has become "0" will provide an output "0" from the register 7 when clocked. This will give an "1" only from the AND gate 25 connected to the output of the register 17 and the upper output of the register 14, all the other AND gates 19, 20, 22, 23, 26 having the output "0". This will give an "1" on the outputs of the OR gates 21 and 24 providing inputs "0" on the inputs of the registers 14 and 15 and a "0" on the output of the OR gate 24 providing inputs "0" on the inputs of the register 16. It is important to realise that there is a two step delay through the encoder 4. The transmission preferably begins with a reference bit R having a known value, which may be either "0" or "1". This makes it possible to automatically correct for reverse wires, and the order in which the wires may be connected to the ports is therefore arbitrary. Consideration to the reference bit is taken when decoding the data stream signals in the receiving port or ports. A sequence of bits d1, d2, d3, ....dn containing the information to be transmitted is thus transmitted as the bit sequence R, d1, d2, d3, ...dn, where R is the reference bit.

The following sequence of data will be given in order to explain the transmission.

| Mi | vi | Mi' | vi' | Rp | Sp | Tp | Rn | Sn | Rn | rst |
|---|---|---|---|---|---|---|---|---|---|---|
| 1 | x | ? | ? | ? | ? | ? | ? | ? | ? | ? |
| 1 | x | 1 | x | ? | ? | ? | ? | ? | ? | ? |
| 1 | x | 1 | x | 0 | 0 | 1 | 1 | 1 | 1 | 0 0 | where Mi' and vi' are the outputs of the registers 6 and 17, respectively and where x means a arbitray bit and where every bit marked ? may assume any value independent of vi or vi'

When the bus is to be activated, the mark bit Mi is set to "0". It is assumed that vi="0". This state is shown in the first line of the table below. After one clock pulse (the second of the table) the output of the register 6 will be Mi'="0". The value of vi at this time will be the first bit transmitted by the bus. In the example described here, this first bit is the reference bit R. After on further clock pusle (the third line of the table below) the value of vi constitutes the first data bit d1 to be transmitted. The phase state is now changed from the idling state to the (0,0,1) state.

| Mi | vi | Mi' | vi' | Rp | Sp | Tp | Rn | Sn | Tn | rst |
|---|---|---|---|---|---|---|---|---|---|---|
| 0 0 | 1 | x | 0 | 0 | 0 | 1 | 1 | 1 | 1 | 0 0 |
| 0 R | 0 | 0 | 0 | 0 | 0 | 1 | 1 | 1 | 1 | 0 0 |
| 0 d1 | 0 | R | 0 | 0 | 1 | 0 | 0 | 1 | 0 | 0 1 |

After one further clock pulse the state of the various signals will be:

| 0 | d2 | 0 | d1 | 1 | 0 | 0 | 1 | 0 | 0 | 1 | 0 | 0 |
|---|---|---|---|---|---|---|---|---|---|---|---|---|
| if R = 1 and | | | | | | | | | | | | |
| 0 | d2 | 0 | d1 | 0 | 1 | 0 | 0 | 1 | 0 | 0 | 1 | 0 |
| if R = 0 | | | | | | | | | | | | |

In the first case the phase state has shifted from (0,0,1) to (1,0,0), that is one step forwards. In the second case the phase state has shifted from (0,0,1) to (0,1,0), that is one step backwards. The following bits d1, d2,...dn are transmitted in the same way one by one for each clock pulse, and as a shift of the phase state forwards by one step, if the bit is a "1" and as a shift one step backwards, if the bit is a "0".

When the last data bit dn has been supplied to the encoder the mark signal Mi is set to "1" in order to set the bus in the idling state ( the first line in the table below). After one further clock pulse (the second line of the table Mi'=1, and after one further clock pulse (the third line of the table) the bus is set to the idling state. The phase state change — one step forwards or one step backwards — between the first and the second lines of the table below constitutes the transmission of the last data bit dn.

| M | vi | M' | vi' | Rp | Sp | Tp | Rn | Sn | Tn | r | s | t | |
|---|---|---|---|---|---|---|---|---|---|---|---|---|---|
| 1 | x | 0 | dn | ? | ? | ? | ? | ? | ? | ? | ? | ? | bit n-1 |
| 1 | x | 1 | x | ? | ? | ? | ? | ? | ? | ? | ? | ? | bit n |
| 1 | x | 1 | x | 0 | 0 | 0 | 1 | 1 | 1 | 1 | 0 | 0 | |

Figure 5:
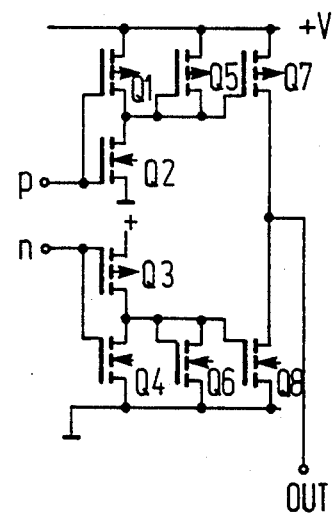
FIG. 5 shows an embodiment of a driver in the port circuit shown in FIG. 3.

The driver 5 includes one circuitry of the kind shown in FIG. 5 for each one of the double outputs of the registers 14, 15, 16. Each of the double outputs has one output referenced p and the other referenced n. The circuitry in FIG. 5 has two symmetric circuits functioning as current generators, one of them having an input p and the other an input n. The symmetric circuits have their outputs interconnected to provide the output OUT of the circuitry. The output OUT of each of the three driver circuits is connected to an individual of the three bus conductors R, S, T. When the two inputs have not the same value, i.e. the signal Mi' obtained from the register 6 in FIG. 4 is a "1", then the output will have the mean value $V_Z$. When the signal Mi'is "0" the outputs will be alike. When this is the case two input signals "false" (=0) will give a low output OUT, and two input signals "true" will give a high output OUT.

The input p controls the current generator including the p-channel MOS-FET transistors Q1, Q5, Q7 and the n-channel MOS-FET transistor Q2. The source of the n-channel MOS-FET transistor Q2 is connected to ground, the drains of the n-channel MOS-FET transistor Q2 and the p-channel MOS-FET transistor Q1 are connected to each other and the source of the p-channel MOS-FET transistor Q1 is connected to a voltage +V. The p-channel MOS-FET transistor Q5 is diode coupled having its gate connected to its drain, which is connected to the drains of the transistors Q1, Q2 and to the gate of the p-channel MOS-FET transistor Q7. The sources of the p-channel MOS-FET transistors Q5 and Q7 are connected to the voltage +V and the drain of the transistor Q7 is connected to the output OUT.

The input p is fed to the gates of the transistors Q1 and Q2. When it is false (low voltage in this embodiment) then the transistor Q2 will conduct but not the transistor Q1. The drain of the transistor Q5 and the gate of the transistor Q7 will be laid on the potential +V through the transistor Q1. The transistor Q7 will be non-conducting. When the input p is true (high voltage in this embodiment) then the transistor Q1 will conduct but not the transistor Q2. The transistor Q2 and the diode Q5 will provide a voltage divider for the gate of the transistor Q7. The voltage across the diode Q5 controls the output current through the transistor Q7 being a current generator. By scaling the transistors Q2 and Q5 an appropriate voltage is achieved controlling the current on the output OUT.

The lower circuit in FIG. 5 is complementary built to the upper circuit and includes a p-channel MOS-FET transistor Q3 and three n-channel MOS-FET transistors Q4, Q6 and Q8, the transistor Q6 being diode coupled having its gate connected to its drain. The input n is fed to the gates of the transistors Q4 and Q3. When it is true then the transistor Q4 will conduct but not the transistor Q3. The drain of the transistors Q6 and the gate of the transistor Q8 will be laid on ground potential through the transistor Q4. When the input n is false then the transistor Q3 will conduct but not the transistor Q4. The transistor Q3 and the diode Q6 will provide a voltage divider for the gate of the transistor Q8. The voltage across the diode Q6 controls the output current through the transistor Q8 being a current generator. By scaling the transistors Q3 and Q6 an appropriate voltage is achieved controlling the current on the output OUT.

--- input p = false leads to no current from upper circuit
input p = true leads to current from upper circuit
input n = true leads to no current from lower circuit
input n = false leads to current from lower circuit

---

Thus, when the signal Mi' is "1" then p is false and n true. Then there is no current on the output of the circuit in FIG. 5. When both the inputs p, n are false only the lower circuit will generate a current, which for instance is −3.2/mA and which gives a "false" output "0". When both the inputs p, n are true only the upper circuit will generate a current, which for instance is 1.6/mA and which gives a "true" output "1" OUT.

Figure 6:
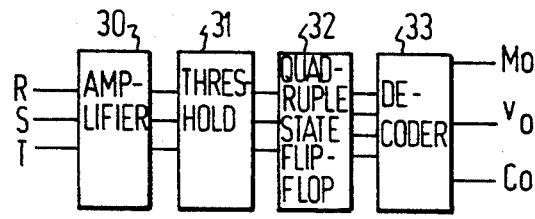
FIG. 6 shows an embodiment of a receiving port circuit.

The embodiment of the receiving port 2 or 3 in FIG. 1 shown in FIG. 6 includes an amplifier 30 for amplifying the incoming signals R, S, T on the three-wire bus, a threshold circuit 31, a quadruple state flip-flop having four outputs, the meaning of which will be described below, and a decoder 33 having the output signals Mo, vo and the transmitted clock signal Co.

Figure 7:
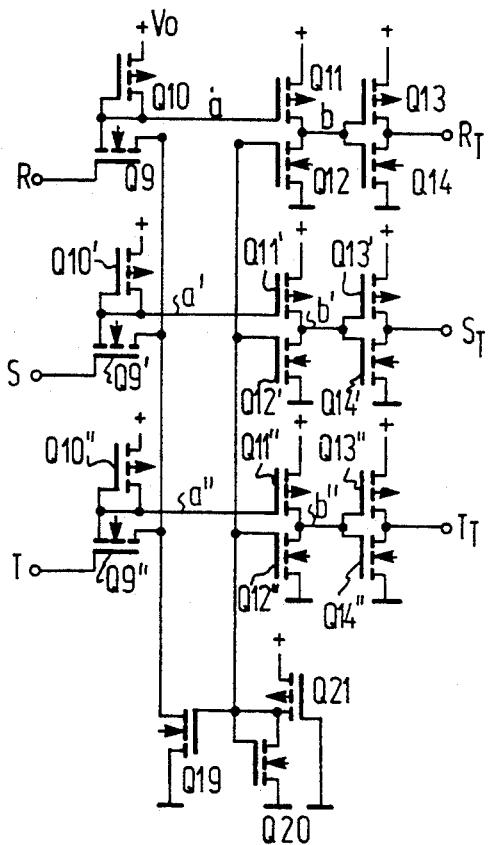
FIG. 7 shows an embodiment of an amplifier and threshold device in the port circuit shown in FIG. 6.

A combined circuitry of an embodiment of the amplifier 30 and the threshold circuit 31 is shown in FIG. 7. There is one amplifier and threshold circuit for each of the wire signals R, S, T. Only one of them will be described together with a control circuit common to all three circuits. A n-channel MOS-FET transistor Q9 has its gate connected to the incoming wire signal R, its drain, node a, connected to the voltage +Vo through a diode coupled p-channel MOS-FET transistor Q10 and to the gate of an other p-channel MOS-FET transistor Q11 having its source connected to +Vo and its drain, node b, to the drain of a n-channel MOS-FET transistor Q12, having its source connected to ground. The drains of the transistors Q11 and Q12 are connected to the interconnected gates of a p-channel MOS-FET transistor Q13 having its source connected to +Vo and a n-channel MOS-FET transistor Q14 having its source connected to ground. The drains of the transistors Q13 and Q14 are interconnected. This interconnection is the output $R_T$ of the threshold circuit. The other two circuits for the wire signals S and T have the same construction as described above and have therefore been provided with the same references but being provided with a' or a", respectively. Their outputs are $S_T$ and $T_T$, respectively.

A circuit common for the three circuits for the wires includes a n-channel MOS-FET transistor Q19 having its drain connected to the source of the transistors Q9, Q9', and Q9", its source connected to ground and its gate connected to the gate of the transistors Q12, Q12', and Q12" and to the interconnected gate/drain of a diode coupled n-channel MOS-FET transistor Q20 and to the drain of a p-channel MOS-FET transistor Q21 having its source connected to +Vo and its gate to ground.

If for instance the input signals has a nominal mean voltage of 2.5 V there is a common-mode voltage range of for instance 2.0 or 4.0 V that must be sustained. (Common-mode voltage is the amount of voltage common to the input lines.) Therefore, the preamplifier has an input stage with low gain and a large common-mode voltage range including the transistor Q19 operating as a current generator and the three current dividers including the transistors Q9, Q9' and Q9". An amplifying threshold stage follows. The current is loaded into the MOS diodes Q10, Q10', Q10". The node a at the drain of Q10 (Q10', Q10") is designed for minimum time constant. There is a capacitance consisting of the drains of Q9 and Q10 and the gate of Q10. This capacitance is proportional to the size of the transistors. The resistance of Q10 is also proportional to the size of the transistor. Thus the time constant is independent of the transistor sizes. The gain is proportional to the size ratio of Q10 to Q9. An increasing gain also increases the resistance of Q and therefore the time constant. Thus the gain is kept low. The resistance is inversely proportional to the voltage drop across Q10. It must however be limited because of the necessary common mode range. The current used is therefore the smallest possible, where the capacitance of the following stage is not dominating.

The transistor Q11 (Q11', Q11") is a very unlinear device creating roughly a quadratic current-voltage transfer function. This current is subtracted from the current $I_{ref}$ created by the current generator Q12 (Q12', Q12"). A current lower than $I_{ref}$ discharges the drain node b (b', b"). Thus the voltage falls to zero. If higher, the node b (b', b") is charged and rises to +Vo. Thus, the node b (b', b") will assume — depending on the input signal to the circuit 31 — one of two defined levels, and the same will apply to the output signal $R_R$ from the circuit, as well as to the other two output signals $S_T$ and $T_T$. The threshold between the two states will be determined by the reference current $I_{ref}$ generated by the current generator Q12.

Finally a low capacitance output stage is used. The inverter output stage Q13/Q14 is used for shaping the output pulse and for reducing the capacitance in the node b.

The rise and fall time at the node b must be fast. Therefore the capacitance of the node b should be minimal and the current maximal. The node capacitances consists of the drain capacitaces and the inverter input capacitance. The inverter input capacitance is made as small as possible. The drain capacitance is made as small as possible. The drain capacitance is proportional to the size and thus the current. The transition time should therefore not be increased by only increasing the current. Instead the gain of the transistor Q11 must be made as high as possible. It increases proportional to the gate source voltage. It is limited by the input common mode range.

Thus, briefly stated, the function of the circuit shown in FIG. 7 is the following. A positive input will make the transistor Q9 more conducting; the node a will have a low voltage level; the transistor Q13 will be non-conducting; the transistor Q14 to be conducting; and thereby will the signal $R_T$ be low. The circuit 31 will therefore change the sign of the input signals when a positive input signal is provided. As apparent from FIG. 2, one of the signals R, S, and T always is high and the other two negative, except for the idling state. Therefore, two of the signals $R_T$, $S_T$, and $T_T$ are always high and one of them is low. In the idling state all the signals R, S, T are negative and thus all the output signals $R_T$, $S_T$, and $T_T$ will be high.

Figure 8:
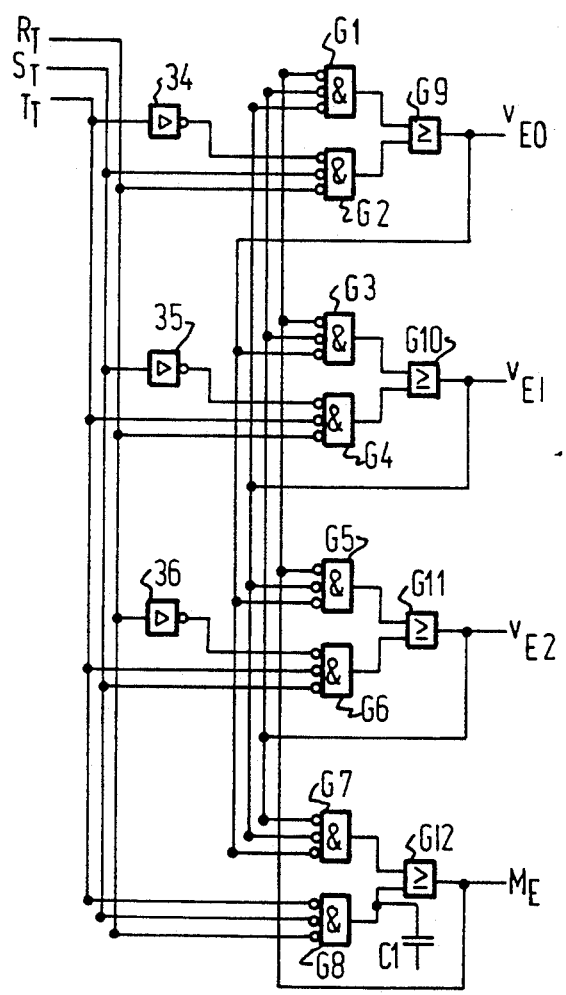
FIG. 8 shows an embodiment of a quadruple state flip-flop in the port circuit shown in FIG. 6.

FIG. 8 shows an embodiment of the quadruple state flip-flop 32. It includes four identical circuits, each including two AND gates G1, G2 and G3, G4 and G5, G6 and G7, G8, respectively, having three inverted inputs each and having their outputs connected to each of two inputs of an OR gate G9, G10, G11 or G12, respectively. The first circuit G1, G2, G9 has the output of the OR gate G9 connected to one of the inverted inputs of the AND gates G3, G5 and G7. The second circuit G3, G4, G10 has the output of the OR gate G10 connected to one of the inverted inputs of the AND gates G1, G5 and G7. The third circuit G5, G6, G11 has the output of the OR gate G11 connected to one of the inverted inputs of the AND gates G1, G3 and G7. The fourth circuit G7, G8, G12 has the output of the OR gate G12 connected to one of the inverted inputs of the AND gates G1, G3 and G5. The AND gate G2 has two of its three inverted inputs fed with the signals $R_T$ and $S_T$ and the third with the signal $T_T$ through an inverter 34. The AND gate G4 has two of its three inverted inputs fed with the signals $R_T$ and $T_T$ and the third with the signal $S_T$ through an inverter 35. The AND gate G6 has two of its three inverted inputs fed with the signals $S_T$ and $T_T$ and the third with the signal $R_T$ through an inverter 36. The AND 3 gate G8 has its three inverted inputs fed with the signals $R_T$, $S_T$ and $T_T$. The output of the AND gate G8 is delayed by a capacitor C1 in order to create a delay of the set signal for the mark signal $M_E$.

The outputs $R_T$, $S_T$, $T_T$ from the amplifying and threshold circuit 30, 31 shown in FIG. 7 constitute the input to the flip-flop circuit. They reflect the signal state of the three conductors of the bus which may be either of the states (0,0,0), (1,0,0), (0,1,0), and (0,0,1). The first state represents an idling bus, which state is assumed when the mark signal Mi supplied to the input port 1 of FIG. 1 is "1". The other three are the three possible phase states assumed by the bus when in the non-idling (active state (the mark signal Mi being "0"). A low voltage on an output of the circuit in FIG. 7 corresponds to a logical "1", and a high voltage to a logical "0".

The flip-flop unit in FIG. 8 has four stable states and is used as a hysteresis device. Each of the input signal combinations referred to in the preceding paragraph sets the flip-flop into one of its four stable states. The flip-flop has the outputs $M_E$, $v_{E0}$, $v_{E1}$, and $v_{E2}$. The combined output is one boolean value for each state, i.e. only one of the output wires from the four circuits has the value true ("1"), the others have the value false ("0"). The gates G2, G4, G6, and G8, together with the inverters 34, 35, and 36, are used for the decoding of the input signals and for setting the flip-flop to the stable state corresponding to the input signal combination The gates G1, G3, G5, and G7 have the function of locking the circuit in of its stable states. The following table gives the output signals of the flip-flop for its four possible signal combinations:

| $R_T$ | $S_T$ | $T_T$ | $v_{E0}$ | $v_{E1}$ | $v_{E2}$ | $M_E$ |
|---|---|---|---|---|---|---|
| 0 | 0 | 0 | 0 | 0 | 0 | 0 |
| 1 | 0 | 0 | 1 | 0 | 0 | 0 |
| 0 | 1 | 0 | 0 | 1 | 0 | 0 |
| 0 | 0 | 1 | 0 | 0 | 1 | 0 |

Figure 9:
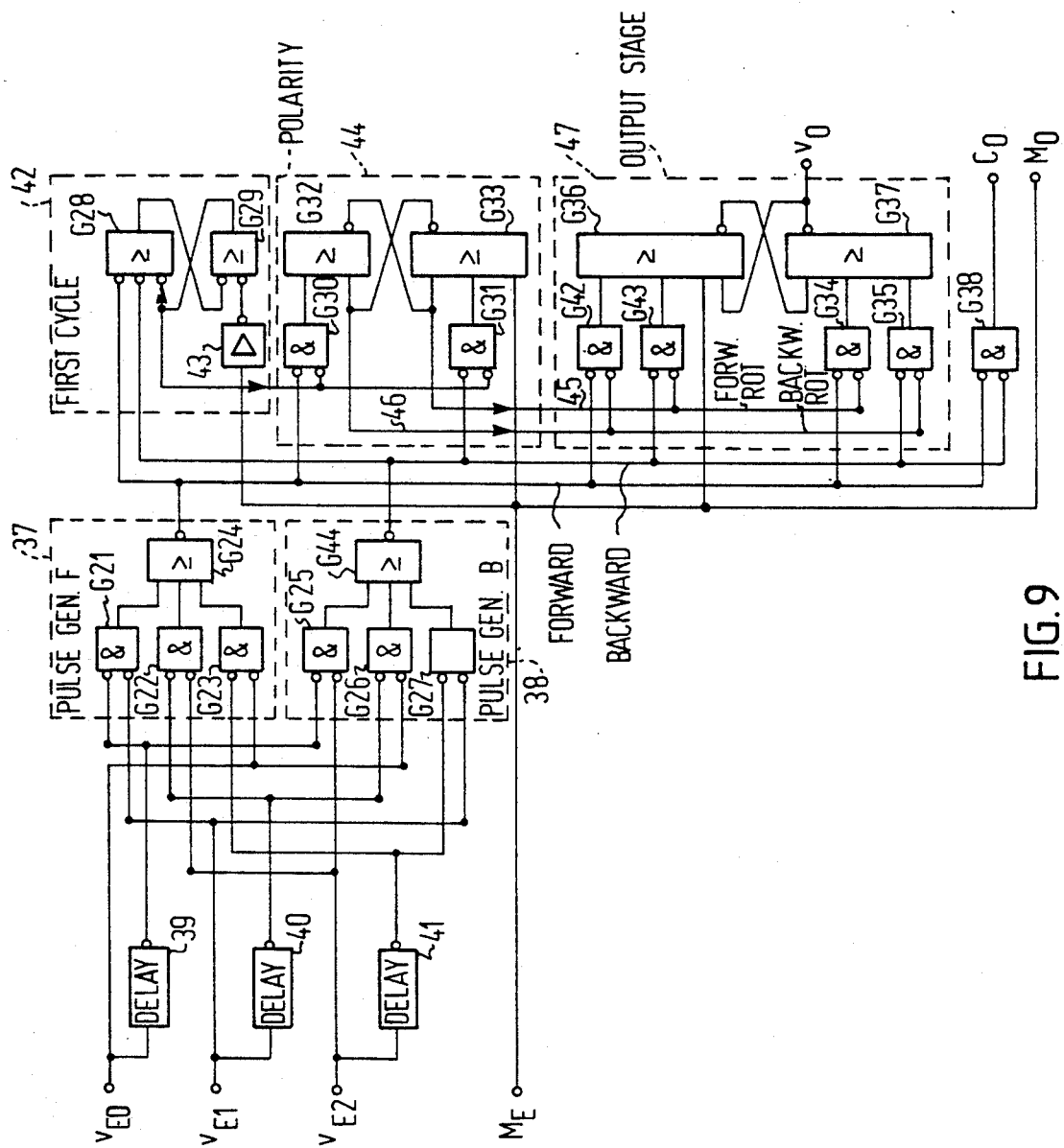
FIG. 9 shows an embodiment of a decoder in the port circuit shown in FIG. 6.

An embodiment of the decoder 33 is shown in FIG. 9. The decoder reads the output states of the flip-flop unit 32 and creates three output signals, Mo, vo and Co. The signal Mo is true ("1") during the non transfer periods. For each input bit there is a clock pulse Co. At the same time there is a decoded bit on vo.

Thus the following states are due:

1. If the signal Mo is true, i.e. "1", there is no transmission and the signals vo an Co are not valid. This state can be used to read a shift-register (not shown) having the signal vo as an input and which has been filled during a precedent transfer phase.

2. If the signal Mo is false, i.e. "0", the signal vo is valid when the signal Co is true, i.e. "1". The signal Co can be used as a clock signal to the shift-register having the signal vo as an input.

The clock signal Co is true during a fixed period, e.g. during 1 ns. The false period of the clock signal Co can be of an arbitrary length. The length of the fixed period, given as an example, is an appropriate length for transmission with a bit rate up to 500/MHz.

The embodiment shown in FIG. 9 includes a pulse generator 37 giving output pulses for forward rotation, and a pulse generator 38 giving output pulses for backward rotation. The pulse generator 37 includes three AND gates G21, G22, G23 each having two inverted inputs and having its output connected to a separate input of an OR gate G24 having an inverted output. The pulse generator 38 includes three AND gates G25, G26, G27 each having two inverted inputs and having its output connected to a separate input of an OR gate G44 having an inverted output.

The input $v_{E0}$ from the circuit in FIG. 8 is directly connected to one of the inverted inputs of the AND gate G23 in the generator 37 and to one of the inverted inputs of the AND gate G26 in the generator 38. The input $v_{E0}$ is also through a delay unit 39 having an inverted output connected to one of the inverted inputs of the AND gate G21 in the generator 37 and to one of the inverted inputs of the AND gate G25 in the generator 38. The input $v_{E1}$ is directly connected to one of the inverted inputs of the AND gate G21 in the generator 37 and to one of the inverted inputs of the AND gate G27 in the generator 38. The input vm is also through a delay unit 40 having an inverted output connected to one of the inverted inputs of the AND gate G22 in the generator 37 and to one of the inverted inputs of the AND gate G26 in the generator 38. The input $v_{E2}$ is directly connected to one of the inverted inputs of the AND gate G22 in the generator 37 and to one of the inverted inputs of the AND gate G25 in the generator 38. The input $v_{E2}$ is also through a delay unit 41 having an inverted output connected to one of the inverted inputs of the AND gate G23 in the generator 37 and to one of the inverted inputs of the AND gate G27 in the generator 38. The delay circuits 39, 40 and 41 has the delay of for instance 1 ns mentioned above for giving the fixed clock period for "true" of the clock signal Co.

The outputs of the pulse generators 37 and 38 and the mark signal $M_E$ are fed to inputs of a first flip-flop 42, which is set to have an output "1", when the mark signal $M_E$ is "1", and is set to have an output "0" when the mark signal $M_E$ is "0".

The flip-flop 42 includes a first OR gate G28 having three inverted inputs, of which a first is connected to the output of the generator 37 and a second to the output of the generator 38. The non-inverted output of the OR gate G28 is connected to an inverted input of a second OR gate G29 having two inverted inputs and having its non-inverted output connected to the third inverted input of the OR gate G28 and also to the output of the flip-flop 42. An amplifying inverter 43 has its non-inverted input connected to receive the input $M_E$ and its inverted output connected to the second inverted input of the OR gate G29.

When the bus is brought to its active state at the beginning of a transmission the bus assumes an initial phase state, for instance (1,0,0). The input wires to the circuit in FIG. 7 could be connected in any way to the three inputs. Therefore any of the inputs $V_{E0}$, $V_{E1}$ and $V_{E2}$ could be true. At the transition of the mark signal from true to false no information is transferred. Therefore no action takes place, but the flip-flop 42 is set to "0".

The outputs from the generators 37 and 38 and the signal $M_E$ is also connected to a second flip-flop 44 having two outputs 45 and 46, and is set to provide a "0" on one of them (45), when the pulse generator 37 gives an output pulse, and is set to provide a "0" on the other (46), when the pulse generator 38 gives an output pulse. The outputs are inverted to each other.

The polarity flip-flop 44 includes two AND gates G30 and G31, each having two inverted inputs and a non-inverted output. One of their inputs is connected to the output of the flip-flop 42. Thus, the AND gates have an output "0", when the output of the flip-flop 42 is "1" and function as inverters for the signal at their second input when the output of the flip-flop 42 is "0", i.e. when a data transmission is made. The output of the AND gate G30 is connected to one input of an OR gate G32 having two non-inverted inputs and an inverted output. The output of the AND gate G31 is connected to one input of an OR gate G33 having three non-inverted inputs and an inverted output. The inverted output of the OR gate 32 is connected to the second input of the OR gate G33 and the inverted output of the OR gate G33 is connected to the other input of the OR gate 32.

The output of the pulse generator 37 is connected to the second inverted input of the AND gate G30. When this output is "0" and assuming that the output from the flip-flop 42 is "0", the output of the gate G30 will be "1" and the output of the gate G32 be "0" giving an output "0" on the output 45. The output of the pulse generator 38 is connected to the second inverted input of the AND gate G31. When this output is "0" and assuming that the output from the flip-flop 42 is "0", the output of the gate G31 will be "1" and the output of the gate G33 be "0" giving an output "0" on the output 46.

A third flip-flop 47 provides the output vo. It includes four AND gates G42, G43, G34, G35, each having two inverted inputs and a non-inverted output, and two OR gates G36 and G37. The gate G36 has four non-inverted inputs and an inverted output. The gate G37 has three non-inverted inputs and an inverted output. The non-inverted output of the OR gate G37 provides the output signal vo. The output of the gates G42 and G43 are connected to an input each of the gate G36. The output of the gates G34 and G35 are connected to an input each of the gate G37. The signal $M_E$ is connected to the third input of the OR gate G36. The inverted output of the gate G36 is connected to the third input of the OR gate G37, and the inverted output of the gate G37 is connected to the fourth input of the OR gate G36.

The output 45 of the flip-flop 44 is connected to one of the inverted inputs of the AND gates G43 and G34 setting them in operation to let through a "0" signal coming to their other input when there is a "0" on the output 45. The output 46 of the flip-flop 44 is connected to one of the inverted inputs of the AND gates G42 and G35 setting them in operation to let through a "0" signal coming to their other input when there is a "0" on the output 46. The output of the generator 37 is connected to the other of the inverted inputs of the AND gates G42 and G34. The output of the generator 38 is connected to the other of the inverted inputs of the AND gates G43 and G35.

The outputs of the pulse generators 37 and 38 are also connected to each of two inverted inputs of an AND gate G38 having a non-inverted output connected to the output Co, which gives a pulse every time there is a "0" on the generator outputs simultaneously.

The mark signal $M_E$ is directly connected to the output Mo.

It is to be noted that the circuits shown in FIGS. 3 to 9 only are embodiments of suitable circuits to provide port circuits for the transmission bus and that several other kinds of circuits can be provided instead of them.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

We claim:

1. A method for serial transmission of a train of pieces of information, being of at least two kinds, a first kind being a binary digit "1", a second kind being a binary digit "0", comprising the steps of:
   a) transforming the train of pieces of information into at least three varying analog signals which together make a train of combination information signals, each combination information signal providing a piece of information, each piece of information of the first and second kind being composed of at least three signal levels, of which at least two are the same, distributed on at least three analog signals, a mean value of the potentials of the analog signals for each combination information signal in the train being approximately constant and independent of the information signal for an actual piece of information to be transferred;
   b) providing each combination information signal of the first and second kind as a change of the signal levels of at least two of said at least three analog signals, at least one of said at least three analog signals having an unchanged signal level, the kind of piece of information determining which analog signals are to have changed signal levels;
   c) transferring a series of combination information signals across a same number of conductors as the analog signals; and
   d) transforming said train of combination information signals back to the train of pieces of information.

2. A method according to claim 1, wherein said pieces of information are of three kinds, the first kind being said binary digit "1", said second kind being said binary digit "0", and a third kind being "idling", and that for said piece of information "idling", the combination information signal is provided as the means potential value of each of said at least three analog signals.

3. A method according to claim 2, wherein transmission of said pieces of information provides a sequence of signal conditions chosen among a number of different signal conditions ((Z,Z,Z), (H,L,L), (L,H,L), (L,L,H)), H denoting a first signal condition, L denoting a second signal condition, and Z denoting a third signal condition which is the mean potential value of said at least three analog signals.

4. A method according to claim 1, wherein there are at least three different combinations of signal levels of said combination information signals for the pieces of information of the first and second kind, said combinations being set in a prescribed order, in that one kind of piece of information, for instance "0", is transmitted by a change of combination in said prescribed order and the other kind of piece of information, for instance "1", is transmitted by a change of combination backwards against said prescribed order.

5. A method according to claim 4, wherein said change of combination is controlled by a clock signal, and that said clock signal is derived from the transferred series of combination information signals upon transforming them back into said pieces of information.

6. A method according to claim 2, wherein for a serial transmission of a sequence of pieces of information, said sequence is commenced and ended by providing an idling nominal signal level as combination information signal on all said analog signals.

7. A method for serial transmission of a train of pieces of information, being of at least two kinds, the first kind being a binary digit "1", the second being a binary digit "0", comprising the steps of:
   a) transforming the train of pieces of information into varying analog signals which together make a train of combination information signals, a mean value of the potentials of the analog signals for each combination information signal in the train being approximately constant and independent of the information signal for the actual piece of information to be transferred;
   b) transferring a series of combination information signals across a same number of conductors as the analog signal;
   c) transforming said train of combination information signals back to the train of pieces of information;
   d) providing at least three different combinations of a first, second and third signal levels of said analog signals, said combinations being set in a prescribed order; and
   e) transmitting one kind of piece of information, for instant "0", by a change of combination of said prescribed order and the other kind of piece of information, for instance "1" is transmitted by a change of combination backwards against said prescribed order.

8. A method according to claim 7, wherein for a serial transmission of a piece of information sequence, said sequence is commenced and ended by providing an idling nominal signal level as combination information signal on all the analog signals, said nominal signal level being different from said first and said second signal levels, and a signal sequence after said idling signal begins from a starting combination.

9. A method according to claim 7, wherein each sequence of transmitted piece of information sequence starts with a reference piece of information and a direction of said change of order is sensed using said reference piece of information.

10. An electronic communication link for serial transmission of pieces of information, being at least of two kinds, a first kind being a binary digit "1", a second kind being a binary digit "0", comprising:
   a) a multiple conductor constellation having at least three conductors, said constellation having an input side and an output side;
   b) at least one transmission port (1) connected to said input side of said constellation to which information to be transferred is provided as a series of said pieces of information and which transforms the train of pieces of information into at least three varying signals each provided on a separate conductor which together make a train of combination information signals, each combination information signal providing a piece of information;
   c) at least one receiving port (2, 3) connected to said output side of said constellation receiving said train of combination information signals from said conductors in said constellation and converting said train back into said train of pieces of information;

d) the transformation port (1) is adapted to transform each piece of information of the first and second kind to at least three signal levels, of which at least two ($V_L$) of said at least three signal levels are the same and at least one ($V_H$) of said at least three signal levels is different, and said transmission port provides each of said at least three signal levels on an individual of said at least three conductors (R,S,T), a mean value ($V_Z$) of the potentials of said combination information signals on the conductors being approximately constant; and e) the transmission port (1) is adapted to provide each piece of information of the first and second kind as a change of the signal levels on at least two of said at least three conductors, the signal level on at least one of the conductors being kept constant, the kind of piece of information determining which conductors are to have changed signal levels.

11. An electronic communication link according to claim 10, wherein the kinds of pieces of information to be transferred through said link are at least three, the first being said binary digit "1", said second being said binary digit "0", and a third being "idling", and that for the piece of information "idling" the combination information signal provides the mean value ($V_Z$) on each of said at least three analog signals.

12. An electronic communication link according to claim 10, wherein said transmission port 1 provides a sequence of signal conditions chosen among a number of different signal conditions ((Z,Z,Z), (H,L,L), (L,H,L), (L,L,H)) on said conductors, H denoting a first signal condition, L denoting a second signal condition, and Z denoting a third signal condition which is the mean potential value of said signals on said conductors.

13. An electronic communication link according to claim 10, wherein there are three different combinations (H,L,L), (L,H,L), (L,L,H) of signal conditions for the pieces of information of the first and second kind, H denoting said first signal condition, and L denoting said second signal condition on said conductors, said combinations being set in a prescribed order, said transmission port (1) is operative to transmit one kind of piece of information, for instance said first kind "0", by a change of combination in said prescribed order and the other kind of piece of information, for instance said second kind "1", by a change of combination backwards against said prescribed order.

14. An electronic communication link according to claim 10, wherein said transmission port (1) for a serial transmission of a sequence of a piece of information for pieces of information of the first and second kind, commences and ends said sequence by providing said means potential value as an idling nominal signal level $V_Z$ on said conductors.

15. An electronic communication link for serial transmission of pieces of information, being of at least two kinds, the first being a binary digit "1", the second being a binary digit "0", comprising:

a) a multiple conductor constellation having a number of conductors, said constellation having an input side and an output side;

b) at least one transmission port (1) connected to said input side of said constellation to which information to be transferred is provided as a series of said pieces of information and which transforms a train of the pieces of information to varying signals each provided on a separate conductor which together make a train of combination information signals;

c) at least one receiving port (2, 3) connected to said output side of said constellation receiving said train of combination information signals from said conductors in said constellation and converting said train of combination information signals back into said train of pieces of information;

d) said transmission port (1) being adapted to provide at least three different combinations of signal conditions ((H,L,L), (L,H,L), (L,L,H)) on said conductors, H denoting a first signal condition and L denoting a second signal condition on said conductors, said combinations being set in a prescribed order; and e) one kind of piece of information, for instance said first kind "0", is adapted to be transmitted by a change of combination in said prescribed order and the other kind of piece of information, for instance said second kind "1", is adapted to be transmission by a change of combination backwards against said prescribed order.

16. An electronic communication link according to claim 15, wherein said transmission port (1) for serial transmission of a sequence of a piece of information, commences and ends said sequence by providing an idling nominal signal level ($V_Z$) on all the conductors different from said first and said second signal conditions; and a signal sequence after said idling signal begins from a starting combination.

17. An electronic communication link according to claim 15, wherein each sequence of transmitted pieces of information sequence starts with a reference piece of information (R), and wherein a decoder connected to said conductors includes means for sensing a direction of said change order by means of said reference piece of information.

* * * * *